(12) United States Patent
Kuno et al.

(10) Patent No.: US 11,282,734 B2
(45) Date of Patent: Mar. 22, 2022

(54) ELECTROSTATIC CHUCK AND METHOD FOR MANUFACTURING THE SAME

(71) Applicant: NGK INSULATORS, LTD., Nagoya (JP)

(72) Inventors: Tatsuya Kuno, Nagoya (JP); Ikuhisa Morioka, Handa (JP); Takashi Kataigi, Handa (JP); Kenichiro Aikawa, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 273 days.

(21) Appl. No.: 16/717,106

(22) Filed: Dec. 17, 2019

(65) Prior Publication Data
US 2020/0126837 A1 Apr. 23, 2020

Related U.S. Application Data

(63) Continuation of application No. PCT/JP2018/039939, filed on Oct. 26, 2018.
(Continued)

(51) Int. Cl.
*H01L 21/683* (2006.01)
*B23Q 3/15* (2006.01)
(Continued)

(52) U.S. Cl.
CPC .......... *H01L 21/6833* (2013.01); *B23Q 3/15* (2013.01); *H01L 21/67098* (2013.01); *H02N 13/00* (2013.01)

(58) Field of Classification Search
CPC .. H01L 21/6833; H01L 21/67098; B23Q 3/15
See application file for complete search history.

(56) References Cited

U.S. PATENT DOCUMENTS 8,124,539 B2 * 2/2012 Endoh .............. H01J 37/32082
438/714
8,894,806 B2 * 11/2014 Koshimizu ....... H01J 37/32091
156/345.44
(Continued)

FOREIGN PATENT DOCUMENTS

JP 2002-033376 A1 1/2002
JP 2004-200353 A1 7/2004
(Continued)

OTHER PUBLICATIONS

English translation of the International Preliminary Report on Patentability (Chapter I) (Application No. PCT/JP2018/039939) dated May 14, 2020.
(Continued)

*Primary Examiner* — Scott Bauer
(74) *Attorney, Agent, or Firm* — Burr & Brown, PLLC

(57) ABSTRACT

An electrostatic chuck includes a first ceramic member disk-shaped and having an annular step surface outside a circular wafer holding surface thereof, the annular step surface being at a lower level than the wafer holding surface, the first ceramic member having a volume resistivity that allows Coulomb force to be exerted; a first electrode embedded in the first ceramic member at a position facing the wafer holding surface; a second electrode disposed on the annular step surface of the first ceramic member, the second electrode being independent of the first electrode; and a second ceramic member having an annular shape and configured to cover the annular step surface having the second electrode thereon, the second ceramic member having a volume resistivity that allows Johnsen-Rahbek force to be exerted, wherein an upper surface of the second ceramic member is a focus ring holding surface on which a focus ring is placed.

8 Claims, 4 Drawing Sheets

Related U.S. Application Data

(60) Provisional application No. 62/578,613, filed on Oct. 30, 2017.

(51) Int. Cl.
*H01L 21/67* (2006.01)
*H02N 13/00* (2006.01)

(56) References Cited

U.S. PATENT DOCUMENTS

| | | | |
|---|---|---|---|
| 11,037,811 B2* | 6/2021 | Shiraiwa | H01J 37/32779 |
| 2003/0106647 A1 | 6/2003 | Koshiishi et al. | |
| 2004/0261946 A1 | 12/2004 | Endoh et al. | |
| 2010/0326957 A1 | 12/2010 | Maeda et al. | |
| 2011/0000883 A1 | 1/2011 | Endoh et al. | |
| 2011/0240221 A1 | 10/2011 | Yamamoto et al. | |
| 2015/0206722 A1 | 7/2015 | Yamamoto | |
| 2016/0189994 A1* | 6/2016 | Sasaki | H01L 21/6833 361/234 |
| 2019/0006155 A1* | 1/2019 | Zhao | H01J 37/32541 |
| 2019/0206703 A1* | 7/2019 | Zhao | H01L 21/67109 |
| 2021/0005432 A1* | 1/2021 | Yamaguchi | H01L 21/68757 |

FOREIGN PATENT DOCUMENTS

| | | |
|---|---|---|
| JP | 2005-064460 A1 | 3/2005 |
| JP | 2010-183074 A1 | 8/2010 |
| JP | 4559595 B2 | 10/2010 |
| JP | 2011-009351 A1 | 1/2011 |
| JP | 2011-210958 A1 | 10/2011 |
| JP | 2014-022518 A1 | 2/2014 |

OTHER PUBLICATIONS

International Search Report and Written Opinion (Application No. PCT/JP2018/039939) dated Jan. 15, 2019.

* cited by examiner

ELECTROSTATIC CHUCK AND METHOD FOR MANUFACTURING THE SAME

BACKGROUND OF THE INVENTION

1. Field of the Invention

The present invention relates to an electrostatic chuck and a method for manufacturing the same.

2. Description of the Related Art

Plasma processing apparatuses, such as plasma etching apparatuses, plasma CVD apparatuses, and plasma ashing apparatuses, have been known. In such a plasma processing apparatus, a wafer holding device for holding a wafer is typically installed in a vacuum chamber. The wafer holding device includes an electrostatic chuck for attracting and securing a wafer to be plasma-processed onto a wafer holding surface, and also includes a cooling plate for cooling the electrostatic chuck. Examples of the electrostatic chuck used here include an insulating or dielectric (often ceramic) member having an internal electrode embedded therein. With the wafer placed on the wafer holding surface, the wafer holding device applies a direct-current voltage to the internal electrode to produce an electrostatic force (Coulomb force or Johnsen-Rahbek force), by which the wafer is attracted and secured to the wafer holding surface. In this state, plasma is produced so as to be brought into contact with the wafer. A replaceable focus ring may be placed around the outer perimeter of the wafer holding surface. The focus ring is placed on a focus ring holding surface at a level lower than the wafer holding surface. The focus ring has the function of allowing plasma to be stably distributed to the outer edge of the wafer, and protecting the surface of the electrostatic chuck. During plasma processing of the wafer, not only the wafer but also the focus ring is exposed to plasma and therefore heated. The wafer attracted and secured to the electrostatic chuck is cooled by the cooling plate, with the electrostatic chuck therebetween. However, the focus ring, which is much greater in thickness than the wafer, may not be sufficiently attracted to the electrostatic chuck and may be excessively heated. This may increase the temperature of the outer edge of the wafer, and may reduce yields of the plasma processing process.

Patent Literature 1 describes an electrostatic chuck of anodized aluminum in which a dielectric used for a wafer holding surface and a dielectric used for a focus ring holding surface have different specific resistances, so that a wafer and a focus ring are attracted by Coulomb force and Johnsen-Rahbek force, respectively. Patent Literature 2 describes an electrostatic chuck in which a ceramic member is provided with both a wafer attracting electrode and a focus ring attracting electrode independent of each other, so that only a chuck voltage applied to the focus ring attracting electrode is varied depending on the step of plasma processing. In an etching step where the focus ring tends to be heated to a high temperature, the chuck voltage is increased to increase the attractive force.

CITATION LIST

Patent Literature

PTL 1: Japanese Patent No. 4559595
PTL 2: Japanese Unexamined Patent Application Publication No. 2010-183074

SUMMARY OF THE INVENTION

In the electrostatic chuck described in Patent Literature 1, where the common electrode is shared between the wafer holding surface and the focus ring holding surface, it is not possible to set a voltage appropriate for each of the wafer and the focus ring. In the electrostatic chuck described in Patent Literature 2, where the same ceramic member is provided with both the wafer attracting electrode and the focus ring attracting electrode, it is difficult to attract the wafer with Coulomb force and attract the focus ring with Johnsen-Rahbek force. That is, even with the electrostatic chucks described in Patent Literature 1 and 2, it is not always possible to sufficiently cool the focus ring. There has been demand for electrostatic chucks that are capable of sufficiently attracting a focus ring.

The present invention has been made to solve the problems described above. A primary object of the present invention is to provide an electrostatic chuck capable of sufficiently attracting a focus ring.

An electrostatic chuck according to the present invention includes a first ceramic member disk-shaped and having an annular step surface outside a circular wafer holding surface thereof, the annular step surface being at a lower level than the wafer holding surface, the first ceramic member having a volume resistivity that allows Coulomb force to be exerted;

a first electrode embedded in the first ceramic member at a position facing the wafer holding surface;

a second electrode disposed on the annular step surface of the first ceramic member, the second electrode being independent of the first electrode; and a second ceramic member having an annular shape and configured to cover the annular step surface having the second electrode thereon, the second ceramic member having a volume resistivity that allows Johnsen-Rahbek force to be exerted.

An upper surface of the second ceramic member is a focus ring holding surface on which a focus ring is placed.

During use of the electrostatic chuck, a voltage is applied to each of the first electrode and the second electrode, with the wafer and the focus ring placed on the wafer holding surface and the focus ring holding surface, respectively. This enables Coulomb force to attract the wafer to the wafer holding surface, and enables Johnsen-Rahbek force larger than the Coulomb force to attract the focus ring to the focus ring holding surface. Since the focus ring has a greater thickness than the wafer, it is not easy to correct warpage of the focus ring and attract the focus ring. Because of the large attractive force, however, it is possible to correct warpage of the focus ring and attract the focus ring to the focus ring holding surface. Additionally, since the first electrode and the second electrode are independent of each other, it is possible to apply an appropriate voltage to each of the first electrode and the second electrode.

In the electrostatic chuck according to the present invention, the second ceramic member may be formed by coating or thermal spraying. This enables relatively easy formation of the second ceramic member.

In the electrostatic chuck according to the present invention, the volume resistivity of the first ceramic member is preferably greater than or equal to $1 \times 10^{15}$ Ωcm at an operating temperature, and the volume resistivity of the second ceramic member is preferably greater than or equal to $1 \times 10^8$ Ωcm and less than or equal to $1 \times 10^{13}$ Ωcm at the operating temperature. This makes it possible to reliably achieve the advantageous effects of the present invention. The operating temperature is a temperature at which plasma processing is applied to the wafer. For example, the operating temperature is appropriately set in the range from −100° C. to 150° C., and typically set in the range from the room temperature to 150° C. The volume resistivity of the second ceramic member may be greater than or equal to $1\times10^8$ Ωcm and less than or equal to $1\times10^{11}$ Ωcm at the operating temperature.

In the electrostatic chuck according to the present invention, the second ceramic member is preferably made of ceramic doped with a group IV element in the periodic table. The ceramic of this type is suitable for being thermally sprayed. Examples of the group IV element in the periodic table include titanium, zirconium, and hafnium. The amount of the group IV element in the periodic table used for the doping may be appropriately set within a range that allows the volume resistivity of the second ceramic member to be greater than or equal to $1\times10^8$ Ωcm and less than or equal to $1\times10^{13}$ Ωcm at the operating temperature. The second ceramic member made of ceramic doped with the group IV element in the periodic table preferably has the same main component as the first ceramic member. This can make the thermal conductivity and thermal expansion coefficient of the second ceramic member substantially the same as those of the first ceramic member.

In the electrostatic chuck according to the present invention, variation in the thickness of the second ceramic member is preferably not greater than 0.5 mm. Without an excessively thin portion in the second ceramic member, it is less likely that a dielectric breakdown will occur. Also, without an excessively thick portion in the second ceramic member, static can be eliminated in a relatively short time.

In the electrostatic chuck according to the present invention, the second electrode is preferably a bipolar electrode. This facilitates static elimination for preventing poor attachment and detachment caused by residual charge, which is often a problem in Johnsen-Rahbek electrostatic chucks.

In the electrostatic chuck according to the present invention, the annular step surface of the first ceramic member may have an annular recessed groove U-shaped in cross-section, the second electrode may be disposed on a bottom surface of the annular recessed groove, the second ceramic member may cover the bottom surface of the annular recessed groove having the second electrode thereon, and a surface of the second ceramic member may be flush with an upper face of the annular step surface. In this electrostatic chuck, when the focus ring is placed not only on the surface of the second ceramic member, but also over the upper face of the annular step surface at both ends of the surface of the second ceramic member, it is possible to prevent exposure of the second ceramic member. Therefore, even when a material (e.g., sprayed film) which tends to produce particles by being brought into contact with plasma is used as the second ceramic member, adhesion of particles to the wafer can be reduced.

An electrostatic chuck manufacturing method according to the present invention is a method for manufacturing the electrostatic chuck described above. The method includes the steps of (a) preparing the first ceramic member having the first electrode embedded therein;

(b) forming the second electrode on the annular step surface of the first ceramic member by printing or coating; and (c) forming the second ceramic member on the annular step surface by coating or thermal spraying, the annular step surface having the second electrode formed thereon.

In the manufacturing method described above, the second electrode is formed by printing or coating on the annular step surface of the first ceramic member, and then, the second ceramic member is formed over the second electrode by coating or thermal spraying. This facilitates manufacture of any of the electrostatic chucks described above. Since the second ceramic member is formed by coating or thermal spraying, the thickness of the second ceramic member, from the second electrode to the focus ring holding surface, can be made uniform. Additionally, since the second electrode is formed by printing or coating, it is easy to form a plurality of electrodes or an electrode having a complex shape, such as a comb-shaped electrode.

DETAILED DESCRIPTION OF THE INVENTION

Figure 1:
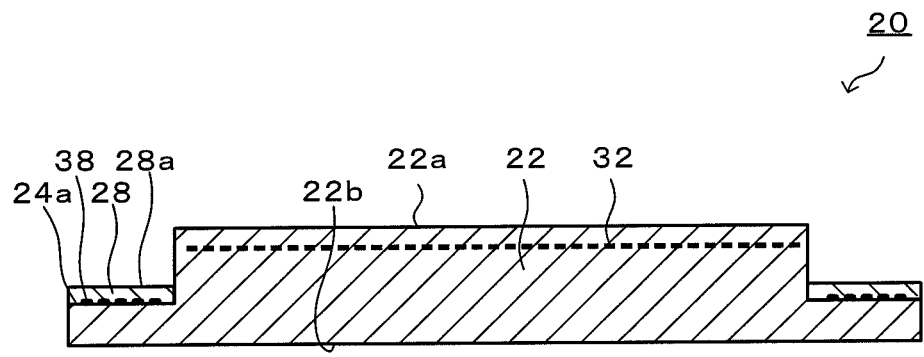
FIG. 1 is a vertical cross-sectional view of an electrostatic chuck 20.
Figure 2A:
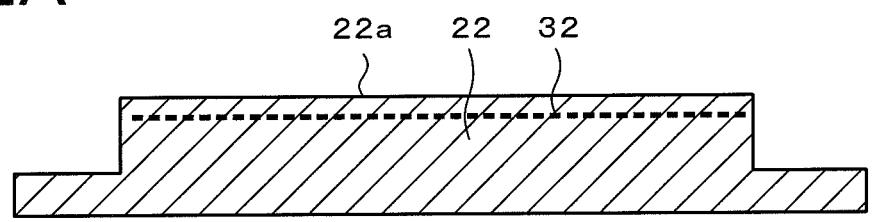
FIGS. 2A to 2C are an explanatory diagram illustrating a method for manufacturing the electrostatic chuck 20.
Figure 2B:
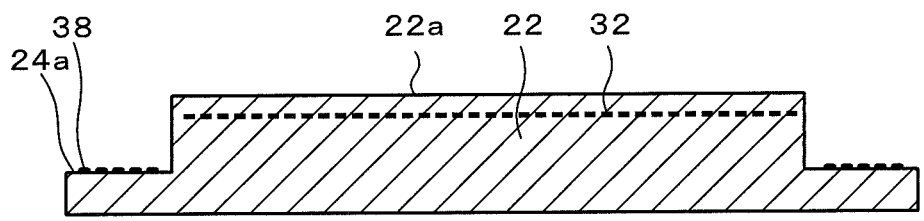
Figure 2C:
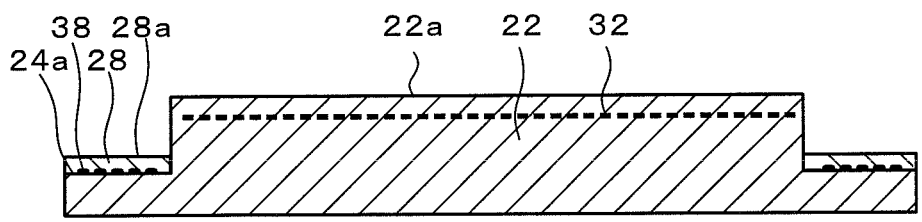
Figure 3:
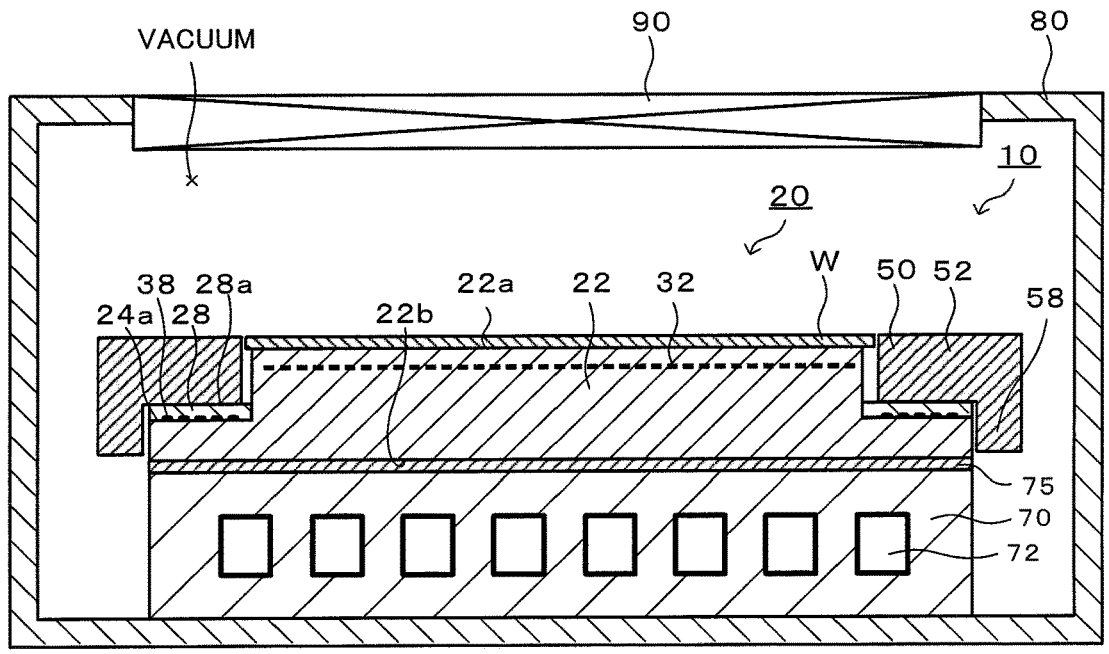
FIG. 3 is an explanatory diagram illustrating how the electrostatic chuck 20 is used for processing a wafer W.

Preferred embodiments of the present invention will now be described with reference to the drawings. FIG. 1 is a vertical cross-sectional view of an electrostatic chuck 20, FIGS. 2A to 2C are an explanatory diagram illustrating a method for manufacturing the electrostatic chuck 20, and FIG. 3 is an explanatory diagram illustrating how the electrostatic chuck 20 is used for processing a wafer W.

The electrostatic chuck 20 is used for a wafer holding device 10 in which etching or CVD is performed on the wafer W using plasma. The wafer holding device 10 is secured to, and used on, the bottom surface of a chamber 80 for semiconductor processing (see FIG. 3). The wafer holding device 10 includes a focus ring 50 and a cooling plate 70 as well as the electrostatic chuck 20.

The electrostatic chuck 20 includes a disk-shaped ceramic substrate 22. The ceramic substrate 22 has a circular wafer holding surface 22a on which the wafer W is placed, and an annular step surface 24a formed around the outer perimeter of the wafer holding surface 22a at a level one step lower than the wafer holding surface 22a. A wafer attracting electrode 32 is embedded in the ceramic substrate 22 at a position facing the wafer holding surface 22a. The annular step surface 24a of the ceramic substrate 22 is provided with a focus ring (F/R) attracting electrode 38 independent of the wafer attracting electrode 32, and the annular step surface 24a with the F/R attracting electrode 38 therein is entirely covered with a sprayed film 28. The upper surface of the sprayed film 28 serves as a focus ring (F/R) holding surface 28a on which the focus ring 50 is placed. The ceramic substrate 22 is bonded to the cooling plate 70, with a bonding sheet 75 interposed therebetween, on a back surface 22b opposite the wafer (W) holding surface 22a.

The ceramic substrate 22 has a volume resistivity that allows Coulomb force to be exerted. The ceramic substrate 22 is made of a ceramic material, such as aluminum nitride, silicon nitride, or aluminum oxide. The Coulomb force can be exerted sufficiently, as long as the volume resistivity is greater than or equal to $1\times10^{15}$ Ωcm at an operating temperature (e.g., temperature set in the range from ambient temperature to 150° C.; the same applies hereinafter). The wafer holding surface 22a of the ceramic substrate 22 is formed to have a diameter smaller than that of the wafer W. Therefore, when the wafer W is placed on the wafer holding surface 22a, the outer edge of the wafer W extends out of the wafer holding surface 22a. The wafer holding surface 22a of the ceramic substrate 22 has a plurality of raised and recessed portions (not shown) formed by embossing. A heat transfer gas (e.g., He gas) is supplied to gaps between the recessed portions of the wafer holding surface 22a and the wafer W (see FIG. 3) on the wafer holding surface 22a, through a gas supply path (not shown) extending from the back surface 22b to the wafer holding surface 22a.

The wafer attracting electrode 32 is formed by a conductive mesh or plate, and disposed parallel (which includes being substantially parallel; the same applies hereinafter) to the wafer holding surface 22a. The back surface of the wafer attracting electrode 32 is connected to a power feed rod (not shown) inserted from the back surface 22b of the ceramic substrate 22. A direct-current voltage is applied through this power feed rod to the wafer attracting electrode 32.

The F/R attracting electrode 38 is a bipolar electrode formed by a conductive printed pattern, in which a pair of spaced-apart comb-shaped electrodes is disposed parallel to the F/R holding surface 28a. The back surface of the F/R attracting electrode 38 is connected to a power feed rod (not shown) inserted from the back surface 22b of the ceramic substrate 22 and passing through the ceramic substrate 22. A direct-current voltage is applied through the power feed rod to the F/R attracting electrode 38.

The sprayed film 28 has a volume resistivity that allows Johnsen-Rahbek force to be exerted. The sprayed film 28 is made of a material obtained by doping the ceramic material of the ceramic substrate 22 with a group IV element in the periodic table (e.g., titanium). The Johnsen-Rahbek force can be exerted sufficiently, as long as the volume resistivity is greater than or equal to $1\times10^{8}$ Ωcm and less than or equal to $1\times10^{13}$ Ωcm (preferably greater than or equal to $1\times10^{8}$ Ωcm and less than or equal to $1\times10^{11}$ Ωcm) at the operating temperature. The sprayed film 28 is formed such that its thickness ranges from 0.05 mm to 2 mm, and that its thickness variation is not greater than 0.5 mm. The F/R holding surface 28a, which is the surface of the sprayed film 28, has a plurality of raised and recessed portions (not shown) formed by embossing. A heat transfer gas (e.g., He gas) is supplied to gaps between the recessed portions of the F/R holding surface 28a and the focus ring 50 (see FIG. 3) on the F/R holding surface 28a, through a gas supply path (not shown). The gas supply path extends from the back surface 22b of the ceramic substrate 22 to the F/R holding surface 28a of the sprayed film 28.

The focus ring 50 is, for example, a metal silicon member, and includes a ring body 52 placed on the F/R holding surface 28a of the electrostatic chuck 20 and a skirt 58 extending downward from the back surface of the ring body 52. To avoid interference with the wafer W, the ring body 52 is formed to have an inside diameter slightly larger than the diameters of the wafer W and the wafer holding surface 22a. The skirt 58 has a cylindrical shape and is formed to have an inside diameter slightly larger than the outside diameter of the F/R holding surface 28a of the electrostatic chuck 20. Therefore, the inner wall of the skirt 58 is slightly spaced apart from the periphery of the electrostatic chuck 20. The focus ring 50 has the function of protecting the wafer W and the electrostatic chuck 20. The focus ring 50 is simply placed on the F/R holding surface 28a without being bonded thereto. When plasma processing to be performed is plasma etching, the material of the focus ring 50 is appropriately selected depending on the type of a film of the wafer W to be etched.

The cooling plate 70 is a disk-shaped plate made of metal, such as aluminum or aluminum alloy, and has an internal refrigerant path 72 which allows circulation of a refrigerant. The refrigerant path 72 is connected to a refrigerant supply path and a refrigerant discharge path passing through the chamber 80. The refrigerant discharged from the refrigerant discharge path is temperature-adjusted and returned to the refrigerant supply path.

A manufacturing method for manufacturing the electrostatic chuck 20 will now be described using FIGS. 2A to 2C. As illustrated in FIGS. 2A to 2C, the manufacturing method includes the steps of (a) preparing the ceramic substrate 22 having the wafer attracting electrode 32 embedded therein, (b) forming the F/R attracting electrode 38 on the annular step surface 24a of the ceramic substrate 22 by printing, and (c) forming the sprayed film 28 by thermal spraying. In the step (a), for example, a sintered ceramic body having the wafer attracting electrode 32 embedded therein is produced by hot press firing, and the resulting sintered ceramic body is subjected to grinding or blasting for adjustment of shape and thickness to obtain the ceramic substrate 22. In the step (b), slurry containing the raw material of the F/R attracting electrode 38 is printed and fired, as necessary, to form the F/R attracting electrode 38. In the step (c), a material (thermal spray material) of the sprayed film 28 is thermally sprayed on the annular step surface 24a having the F/R attracting electrode 38 formed thereon. The thermal spray material is, for example, a ceramic material doped with a group IV element in the periodic table, and is preferably a material obtained by doping the ceramic material of the ceramic substrate 22 with a group IV element in the periodic table.

An example of how the electrostatic chuck 20 is used will now be described using FIG. 3. The wafer holding device 10 including the electrostatic chuck 20 is secured to, and used on, the bottom surface of the chamber 80. A shower head 90 with many gas spray holes through which a process gas is sprayed into the chamber 80 is disposed on the ceiling surface of the chamber 80.

The wafer W having a disk shape is placed on the wafer holding surface 22a of the electrostatic chuck 20. Applying a voltage to the wafer attracting electrode 32 enables Coulomb force to electrostatically attract the wafer W to the wafer holding surface 22a. The temperature of the wafer W can be controlled by regulating the temperature of the refrigerant supplied to the refrigerant path 72 in the cooling plate 70. At this point, a He gas is supplied to the gaps between the wafer W and the recessed portions (not shown) of the wafer holding surface 22a to enhance heat transfer. The temperature of the wafer W is controlled by detecting a wafer temperature with a temperature sensor (not shown) and providing feedback so that the detected temperature reaches a target temperature.

The focus ring 50 having an annular shape is placed on the F/R holding surface 28a of the electrostatic chuck 20. Applying a voltage to the F/R attracting electrode 38 enables Johnsen-Rahbek force to electrostatically attract the focus ring 50 to the F/R holding surface 28a. The temperature of the focus ring 50 can be controlled by regulating the temperature of the refrigerant supplied to the refrigerant path 72 in the cooling plate 70. At this point, a He gas is supplied to the gaps between the focus ring 50 and the recessed portions (not shown) of the F/R holding surface 28a to enhance heat transfer. The temperature of the focus ring 50 is controlled by detecting the temperature of the focus ring 50 with a temperature sensor (not shown) and providing feedback so that the detected temperature reaches a target temperature.

In this state, the chamber 80 is internally set to a vacuum atmosphere (or reduced-pressure atmosphere), and plasma is produced by supplying high-frequency power to the space between the cooling plate 70 and the shower head 90 while supplying a process gas from the shower head 90. Then, CVD or etching is performed on the wafer using the plasma.

Although the focus ring 50 wears out as the plasma processing on the wafer W proceeds, the focus ring 50, which is large in thickness, is not replaced until completion of processing on a plurality of wafers W.

Correspondence relations between constituent elements of the present embodiment and constituent elements of the present invention will now be defined. The ceramic substrate 22 of the present embodiment corresponds to a first ceramic member of the present invention, the wafer attracting electrode 32 corresponds to a first electrode, the F/R attracting electrode 38 corresponds to a second electrode, and the sprayed film 28 corresponds to a second ceramic member.

In the electrostatic chuck 20 described above, during use of the electrostatic chuck 20, a voltage is applied to each of the wafer attracting electrode 32 and the F/R attracting electrode 38, with the wafer W placed on the wafer holding surface 22a of the electrostatic chuck 20 and the focus ring 50 placed on the focus ring holding surface 28a. This enables Coulomb force to attract the wafer W to the wafer holding surface 22a, and enables Johnsen-Rahbek force greater than the Coulomb force to attract the focus ring 50 to the focus ring holding surface 28a. Since the focus ring 50 has a greater thickness than the wafer W, it is not easy to correct warpage of the focus ring 50 and attract the focus ring 50. In the electrostatic chuck 20, where the focus ring 50 is attracted by a large attractive force, it is possible to correct warpage of the focus ring 50 and attract the focus ring 50 to the focus ring holding surface 28a. Therefore, the wafer holding device 10, which includes the electrostatic chuck 20, can sufficiently cool the focus ring 50. Additionally, since the wafer attracting electrode 32 and the F/R attracting electrode 38 are independent of each other, it is possible to apply an appropriate voltage to each of the wafer attracting electrode 32 and the F/R attracting electrode 38.

In the electrostatic chuck 20, the second ceramic member is the sprayed film 28 and thus can be formed relatively easily. The sprayed film 28 is made of ceramic doped with a group IV element in the periodic table, and the ceramic of this type is suitable for being thermally sprayed. The sprayed film 28 is made of a material whose main component is the same as that of the ceramic material of the ceramic substrate 22. Therefore, the thermal conductivity and thermal expansion coefficient of the sprayed film 28 can be made substantially the same as those of the ceramic substrate 22.

In the electrostatic chuck 20, variation in the thickness of the sprayed film 28 is not greater than 0.5 mm. Thus, since the sprayed film 28 does not have an excessively thin portion, it is less likely that a dielectric breakdown will occur. Also, since the sprayed film 28 does not have an excessively thick portion, static can be eliminated in a relatively short time.

In the electrostatic chuck 20, the F/R attracting electrode 38 is a bipolar electrode. This facilitates static elimination for preventing poor attachment and detachment caused by residual charge, which is often a problem in Johnsen-Rahbek electrostatic chucks.

In the method for manufacturing the electrostatic chuck 20 described above, the F/R attracting electrode 38 is formed by printing on the annular step surface 24a of the ceramic substrate 22, and then, the sprayed film 28 is formed over the F/R attracting electrode 38. This facilitates manufacture of the electrostatic chuck 20 which includes, as a single unit, the ceramic substrate 22 and the sprayed film 28 of physical properties different from those of the material of the ceramic substrate 22, and also includes the wafer attracting electrode 32 and the F/R attracting electrode 38 independent of the wafer attracting electrode 32. The electrostatic chuck 20 can thus be easily manufactured, in which the wafer holding surface 22a of the ceramic substrate 22 employs a Coulomb type attracting method, the focus ring holding surface 28a of the sprayed film 28 employs a Johnsen-Rahbek type attracting method, and an appropriate voltage can be applied to each of the wafer holding surface 22a and the F/R holding surface 28a. Since the sprayed film 28 is formed by thermal spraying, the thickness of the sprayed film 28, from the F/R attracting electrode 38 to the F/R holding surface 28a, can be made uniform. Since the F/R attracting electrode 38 is formed by printing, it is easy to form a plurality of electrodes or an electrode having a complex shape, such as a comb-shaped electrode. Both the first ceramic member and the second ceramic member may be sintered ceramic bodies. However, it is relatively difficult, in terms of sinterability, to manufacture two components with different volume resistivities by integral sintering. Since the focus ring 50 greater in thickness than the wafer W is typically used, the F/R holding surface 28a is formed lower than the wafer holding surface 22a and accordingly, the F/R attracting electrode 38 is formed at a lower position than the wafer attracting electrode 32. However, it is relatively difficult to accurately embed the electrodes at different height levels in the sintered ceramic body. Also, the larger the diameter of the sintered ceramic body, the more difficult it becomes to uniformly fire the sintered ceramic body. This means that it is relatively difficult to uniformly fire a large-diameter sintered body in which the F/R attracting electrode 38 is disposed outside the outer perimeter of the wafer attracting electrode 32. In contrast, with the method for manufacturing the electrostatic chuck 20 described above, the electrostatic chuck 20 can be manufactured more easily than in the case where both the first and second ceramic members are sintered ceramic bodies.

The present invention is not at all limited to the embodiment described above, and can be carried out in various modes within the technical scope of the present invention.

For example, although the sprayed film 28 is used in the embodiment described above, the sprayed film 28 may be replaced by a film produced using a different coating technique, such as aerosol deposition. With the thermal spraying or such a coating technique, the thickness can be controlled with relatively high precision. It is therefore easy to obtain a film which exerts a desired attractive force, and the resulting film is suitable for use to ensure insulation.

Although the F/R attracting electrode 38 is a bipolar electrode in the embodiment described above, it may be a monopolar electrode. In the embodiment described above, the wafer attracting electrode 32 may be either a monopolar electrode or a bipolar electrode.

Figure 4:
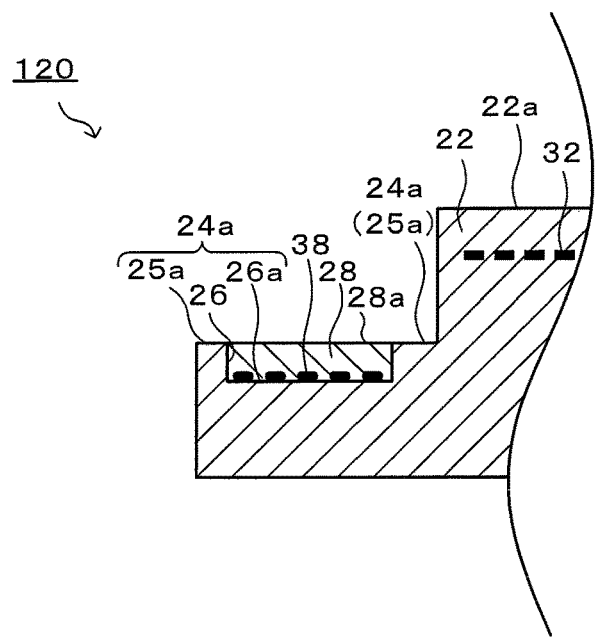
FIG. 4 is a vertical cross-sectional view of an electrostatic chuck 120.
Figure 5:
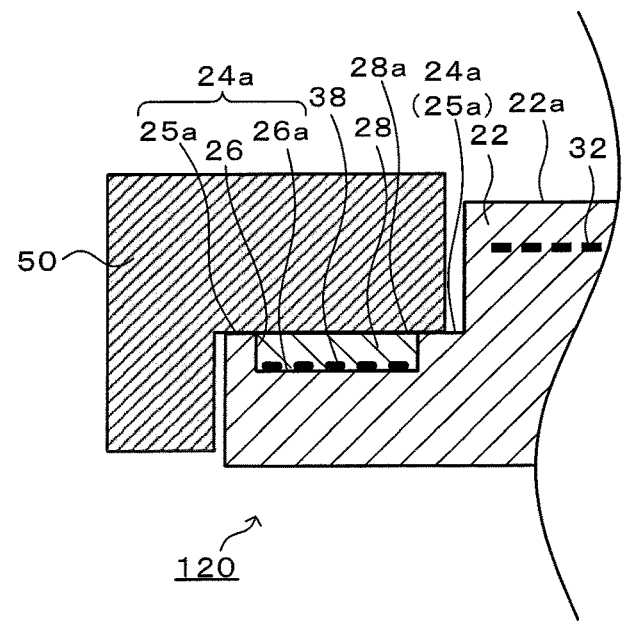
FIG. 5 is an explanatory diagram illustrating how a focus ring 50 is placed on the electrostatic chuck 120.
Figure 6:
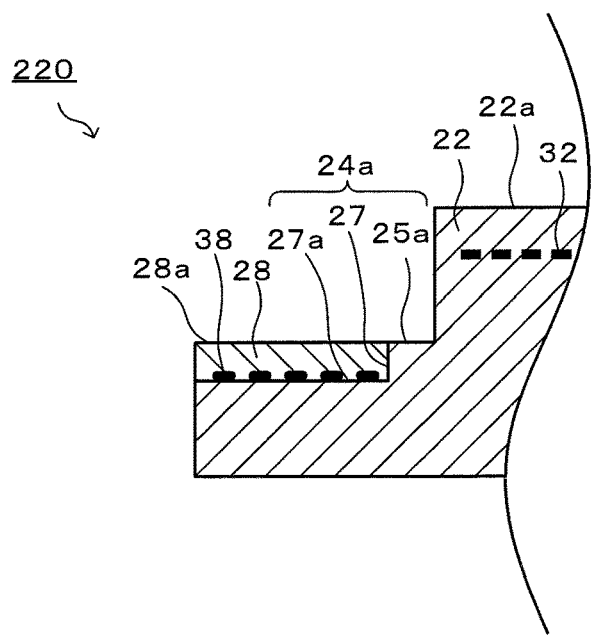
FIG. 6 is a vertical cross-sectional view of an electrostatic chuck 220.
Figure 7:
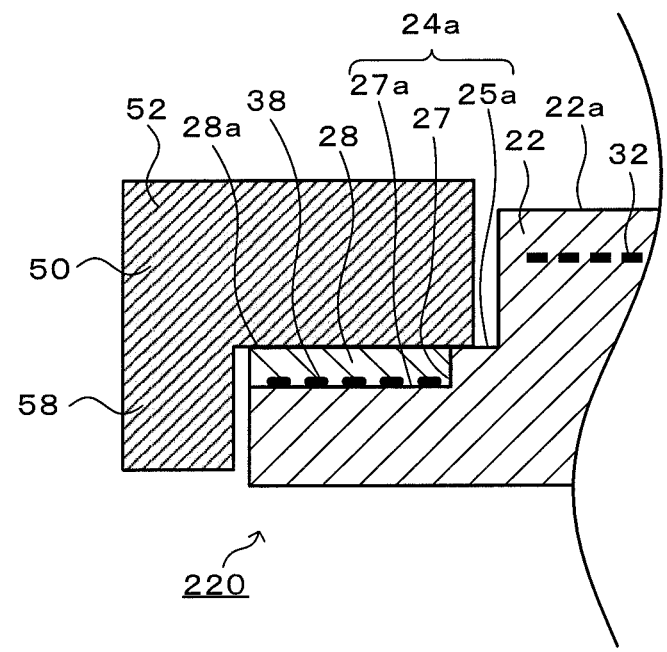
FIG. 7 is an explanatory diagram illustrating how the focus ring 50 is placed on the electrostatic chuck 220.

In the embodiment described above, as in the case of an electrostatic chuck 120 illustrated in FIG. 4, the annular step surface 24a of the ceramic substrate 22 may have an annular recessed groove 26 U-shaped in cross-section, the F/R attracting electrode 38 may be disposed on a bottom surface 26a of the annular recessed groove 26, the sprayed film 28 may cover the bottom surface 26a of the annular recessed groove 26 having the F/R attracting electrode 38 thereon, and the surface of the sprayed film 28 may be flush with an upper face 25a of the annular step surface 24a. In this electrostatic chuck 120, the sprayed film 28 is not exposed when, as illustrated in FIG. 5, the focus ring 50 is placed not only on the surface of the sprayed film 28, but also over the upper face 25a of the annular step surface 24a at both ends of the surface of the sprayed film 28. Therefore, even when the sprayed film 28 is used, adhesion of particles to the wafer W can be reduced. Also, for example, as in the case of an electrostatic chuck 220 illustrated in FIG. 6, the annular step surface 24a of the ceramic substrate 22 may have a notched groove 27 L-shaped in cross-section and extending to reach the side face of the ceramic substrate 22, the F/R attracting electrode 38 may be disposed on a bottom surface 27a of the notched groove 27, and the surface of the sprayed film 28 may be flush with the upper face 25a of the annular step surface 24a. In this electrostatic chuck 220, the sprayed film 28 is not exposed at least to the inner periphery of the focus ring 50 when, as illustrated in FIG. 7, the focus ring 50 is placed not only on the surface of the sprayed film 28, but also over the upper face 25a of the annular step surface 24a along the inner perimeter of the surface of the sprayed film 28. Therefore, even when the sprayed film 28 is used, adhesion of particles to the wafer W can be reduced. Also, since the skirt 58 of the focus ring 50 covers the side face of the sprayed film 28 in FIG. 7, the sprayed film 28 is not exposed to the outer periphery of the focus ring 50.

Figure 8:
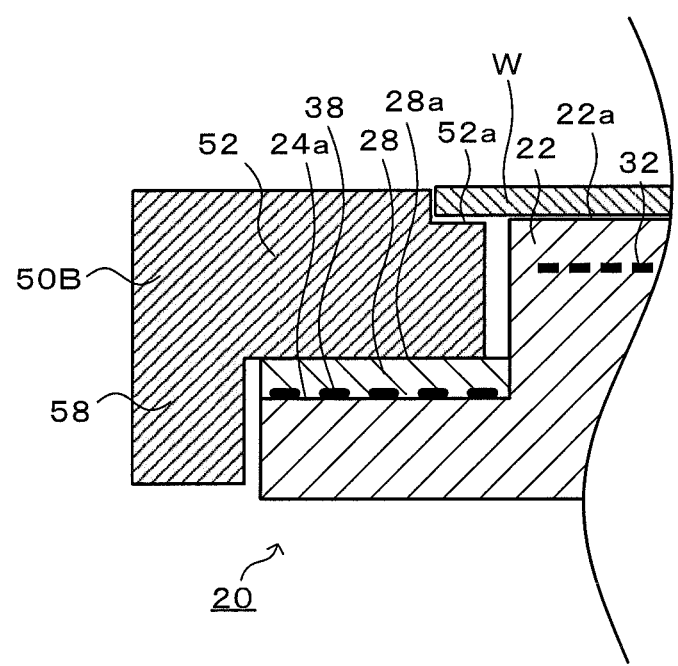
FIG. 8 is an explanatory diagram illustrating how a focus ring 50B and the wafer W are placed on the electrostatic chuck 20.

Although the focus ring 50 has the skirt 58 in the embodiment described above, the focus ring 50 does not necessarily need to have the skirt 58. Like a focus ring 50B illustrated in FIG. 8, the focus ring may have an annular step surface 52a formed along the inner periphery of the upper end portion of the ring body 52. The outside diameter of the annular step surface 52a is made slightly larger than the diameter of the wafer W, so as to avoid interfere with the wafer W. Using this focus ring 50B thus makes it less likely that the sprayed film 28 will come into contact with plasma. Therefore, even when the sprayed film 28 is used, generation of particles can be reduced.

Although the F/R holding surface 28a has a plurality of raised and recessed portions formed by embossing in the embodiment described above, the raised and recessed portions used here may be those produced by thermal spraying for forming the sprayed film 28. Although a heat transfer gas is supplied to the gaps between the recessed portions of the F/R holding surface 28a and the focus ring 50 through the gas supply path extending from the back surface 22b of the ceramic substrate 22 to the F/R holding surface 28a of the sprayed film 28, the gas supply path may be configured differently.

In any of the embodiments described above, a radio frequency (RF) electrode or a heater electrode may be further embedded in the ceramic substrate 22 at a position facing the wafer holding surface 22a. The RF electrode is formed by a conductive mesh and disposed parallel to the wafer holding surface 22a. The back surface of the RF electrode is connected to a power feed rod (not shown) inserted from the back surface 22b of the ceramic substrate 22. An RF voltage is applied through the power feed rod to the RF electrode. The heater electrode is a resistive heating element formed by a conductive coil or printed pattern, and routed parallel to the wafer holding surface 22a and continuously from one end to the other end throughout the area facing the wafer holding surface 22a. The heater electrode is connected at the one and the other ends thereof to a pair of power feed rods inserted into the ceramic substrate 22. A voltage is applied through the power feed rods to the heater electrode. Similarly, an RF electrode or a heater electrode may be embedded in the ceramic substrate 22 at a position facing the annular step surface 24a.

In the embodiment described above, the cooling plate 70 is bonded by the bonding sheet 75 to the back surface 22b of the electrostatic chuck 20. Alternatively, for example, when the cooling plate 70 is made of a ceramic composite material, such as Si—SiC—Ti, the cooling plate 70 may be joined by thermal compression bonding (TCB) to the back surface 22b of the electrostatic chuck 20. TCB refers to a technique in which, with a metal joining material sandwiched between two components to be joined, the two components are joined under pressure by being heated to a temperature lower than or equal to the solidus temperature of the metal joining material.

In the embodiment described above, lift pins for lifting and lowering the wafer W may be provided. In this case, insertion holes for insertion of the lift pins may be formed to pass through the chamber 80, the cooling plate 70, the bonding sheet 75, and the electrostatic chuck 20.

Although the F/R attracting electrode 38 is formed by printing in the step (b) in the embodiment described above, the F/R attracting electrode 38 may be formed by coating. Examples of the coating technique include PVD, CVD, and plating. Although the sprayed film 28 is formed by thermal spraying in the step (c), a film formed by a different coating technique may be used. Examples of the coating technique include a film deposition technique, such as aerosol deposition. As for thermal spraying, any of various thermal spraying techniques, such as cold spraying and suspension plasma spraying, may be employed, as well as thermal spraying techniques typically used.

Although plasma is produced by supplying high-frequency power to the space between the cooling plate 70 and the shower head 90 in the embodiment described above, plasma may be produced by supplying high-frequency power to the space between the shower head 90 and electrostatic electrodes, such as the wafer attracting electrode 32 and the F/R attracting electrode 38. Alternatively, an RF electrode may be provided as described above, and plasma may be produced by supplying high-frequency power to the space between the RF electrode and the shower head 90.

This application is based on and claims priority of U.S. Provisional Patent Application No. 62/578,613, filed on Oct. 30, 2017, the entire contents of which are incorporated herein by reference.

What is claimed is:

1. An electrostatic chuck comprising:
a first ceramic member disk-shaped and having an annular step surface outside a circular wafer holding surface thereof, the annular step surface being at a lower level than the wafer holding surface, the first ceramic member having a volume resistivity that allows Coulomb force to be exerted;
a first electrode embedded in the first ceramic member at a position facing the wafer holding surface;
a second electrode disposed on the annular step surface of the first ceramic member, the second electrode being independent of the first electrode; and a second ceramic member having an annular shape and configured to cover the annular step surface having the second electrode thereon, the second ceramic member having a volume resistivity that allows Johnsen-Rahbek force to be exerted, wherein an upper surface of the second ceramic member is a focus ring holding surface on which a focus ring is placed.

2. The electrostatic chuck according to claim 1, wherein the second ceramic member is formed by coating or thermal spraying.

3. The electrostatic chuck according to claim 1, wherein the volume resistivity of the first ceramic member is greater than or equal to $1\times10^{15}$ $\Omega$cm at an operating temperature; and the volume resistivity of the second ceramic member is greater than or equal to $1\times10^{8}$ $\Omega$cm and less than or equal to $1\times10^{13}$ $\Omega$cm at the operating temperature.

4. The electrostatic chuck according to claim 1, wherein the second ceramic member is made of ceramic doped with a group IV element in the periodic table.

5. The electrostatic chuck according to claim 1, wherein variation in thickness of the second ceramic member is not greater than 0.5 mm.

6. The electrostatic chuck according to claim 1, wherein the second electrode is a bipolar electrode.

7. The electrostatic chuck according to claim 1, wherein the annular step surface of the first ceramic member has an annular recessed groove U-shaped in cross-section;

the second electrode is disposed on a bottom surface of the annular recessed groove; and the second ceramic member covers the bottom surface of the annular recessed groove having the second electrode thereon, and a surface of the second ceramic member is flush with an upper face of the annular step surface.

8. A method for manufacturing the electrostatic chuck according to claim 1, the method comprising the steps of:

(a) preparing the first ceramic member having the first electrode embedded therein;

(b) forming the second electrode on the annular step surface of the first ceramic member by printing or coating; and (c) forming the second ceramic member on the annular step surface by coating or thermal spraying, the annular step surface having the second electrode formed thereon.

* * * * *